United States Patent
Japp et al.

(10) Patent No.: US 6,329,603 B1
(45) Date of Patent: Dec. 11, 2001

(54) LOW CTE POWER AND GROUND PLANES

(75) Inventors: Robert M. Japp; Mark D. Poliks, both of Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/288,051

(22) Filed: Apr. 7, 1999

(51) Int. Cl.$^7$ ........................................................ H05K 1/03
(52) U.S. Cl. .................... 174/255; 174/256; 174/258; 174/262; 174/265; 174/266; 361/792; 361/794; 361/795; 428/901
(58) Field of Search ............................. 174/255, 261, 174/262, 263, 264, 265, 266, 256, 257, 258, 259; 361/792, 793, 794, 795; 428/901

(56) References Cited

U.S. PATENT DOCUMENTS

| | | | |
|---|---|---|---|
| 4,496,793 | * 1/1985 | Hanson et al. | 174/259 |
| 4,654,248 | * 3/1987 | Mohammed | 428/137 |
| 4,814,945 | * 3/1989 | Leibowitz | 361/792 |
| 4,921,054 | * 5/1990 | Voss et al. | 174/255 |
| 4,943,468 | * 7/1990 | Gordon et al. | 428/210 |
| 5,574,630 | * 11/1996 | Kresge et al. | 361/792 |
| 5,830,374 | * 11/1998 | Boyko et al. | 216/13 |
| 5,900,675 | 5/1999 | Appelt et al. | 257/778 |
| 5,919,329 | * 10/1998 | Banks et al. | 156/281 |

OTHER PUBLICATIONS

"High Performance Carrier Technology: Materials And Fabrication", by Light et al, 1993 International Electronics Packaging Conference, San Diego, California, Volume One.

"High Performance Carrier Technology", by Heck et al, 1993 International Electronics Packaging Conference, San Diego, California, Volume One.

"Process Considerations in the Fabrication of Teflon Printed Circuit Boards", by Light et al, 1994 Proceedings, 44 Electronic Components & Technology Conference, 5/94.

* cited by examiner

Primary Examiner—Jeffrey Gaffin
Assistant Examiner—Ib Patel
(74) Attorney, Agent, or Firm—Schmeiser, Olsen & Watts

(57) ABSTRACT

Conductive materials that have low coefficients of thermal expansion (CTEs) and that are used for power and ground planes are disclosed. Fibrous materials (such as carbon, graphite, glass, quartz, polyethylene, and liquid crystal polymer fibers) with low CTEs are metallized to provide a resultant conductive material with a low CTE. Such fibers may be metallized in their individual state and then formed into a fabric, or these materials may be formed into a fabric and then metallized or a combination of both metallizations may be used. In addition, a graphite or carbon sheet may be metallized on one or both sides to provide a material that has a low CTE and high conductivity. These metallized, low CTE power and ground planes may be laminated with other planes/cores into a composite, or laminated into a core which is then laminated with other planes/cores into a composite. The resultant composite may be used for printed circuit boards (PCBs) or PCBs used as laminate chip carriers.

18 Claims, 4 Drawing Sheets

LOW CTE POWER AND GROUND PLANES

RELATED APPLICATION

This application is related to a copending patent application by Japp et al., entitled "POROUS POWER AND GROUND PLANES FOR REDUCED PCB DELAMINATION AND BETTER RELIABILITY", Ser. No. 09/300,762 filed Apr. 26, 1999, and is incorporated herein by reference.

BACKGROUND OF THE INVENTION

1. Technical Field

The present invention relates generally to the field of computer manufacturing and more specifically to reducing the coefficient of thermal expansion of boards used in computers.

2. Background Art

Computers and similar electronic equipment have become ubiquitous elements in the lives of people. Many businesses, banks, and governments rely on computers for their everyday activities. A large portion of the global community require that computers be reliable, stable facets of their economic, societal, and communication foundations. Computers today are required to run longer, with less down-time, than at any time in the past.

Because computers are so necessary, there has been an increased emphasis by computer designers on reliability. Many systems today cannot tolerate the extended down time necessary to replace failed components that make up the computer system. If each component is designed to last longer and be more reliable, then each computer, which is made exclusively of components, will last longer and be more reliable.

This emphasis on reliability of components has been applied to Printed Circuit Boards (PCBs). Most components in a computer system are designed by placing semiconductor packages, containing a semiconductor chip, onto a PCB or by placing chips directly onto Laminated Chip Carriers (LCCs) and connecting the LCCs to the PCB. PCBs are called "printed" because circuit runs or lines of copper are placed on the boards using techniques that were originally similar to the newsprint process. These circuit lines connect the semiconductor packages or chips together. PCBs can be as simple as an insulator that has lines printed on one or both sides and one or more packages attached to one or both sides. PCBs are generally more complex, however, and are usually made of conductive, metal power and ground planes and several signal planes containing circuit lines sandwiched between several layers of insulator, with metal lines and pads on the top and bottom surface of the sandwich. Top and bottom conductors are connected with each other and internal circuit layers with metal plated through holes (PTHs).

PCBs made in this manner have become the standard in electronics. Advances in manufacturing methods have made PCBs relatively inexpensive yet their simplicity makes them reliable. There are, however, problems associated with PCBs. One of the causes of some of these problems is the coefficient of thermal expansion (CTE) for the overall PCB and the individual layers.

Many PCBs and especially LCCs, which are generally composed of organics, need to have a lower CTE that is better matched to the CTE of the silicon chip. When trying to reduce the CTE of the PCB, a variety of dielectrics with lower CTEs are available. However, the effectiveness of using these lower CTE dielectrics is limited because the power and ground planes, which constitute a significant portion of the PCB, are still composed of copper. Copper has a relatively high CTE compared with some of the lower CTE dielectric materials. The relatively high CTE of copper, the high amount of copper, and the high tensile modulus of copper act to maintain a high composite CTE for the board or LCC.

The high CTE power and ground planes cause the overall CTE of the PCB to be similar to the CTE of these metal planes. Because the overall CTE is fairly high, the PCB or LCC itself tends to lengthen and grow in size with increasing temperature. This increase in size means that the chips, packages, lines, and other devices on the surfaces of the PCB or LCC need to expand at the same rate or be able to tolerate the stress caused by the mismatch in size. Sometimes these devices or the electrical connections between them cannot withstand the stress, particularly after repeated temperature cycling.

These stresses are particularly deleterious for LCCs. The chip is connected to the LCC through small solder bumps called Controlled Collapse Chip Connections (C4). The LCC is then connected to a PCB, generally through ball grid arrays (BGAs). An encapsulation and/or undercoating is placed under and around the chip to protect the chip.

Chip carriers were previously made almost exclusively of ceramics, which have low CTEs. Low CTE chip carriers do not place as much stress on the chips because the ceramic layers do not expand that much. Currently, however, laminate materials are being used as chip carriers. Laminate materials have higher CTEs, as explained above, and put more stress on chips connected to the LCC. Unfortunately, because chips are primarily made of crystalline silicon, which is easily fractured, this stress can either fracture the C4 connections or the chip/LCC CTE mismatch will cause the assembled package to warp putting tensile stress on the chip, possibly cracking the chip.

In addition, the metal layers commonly used in PCB manufacturing have much higher CTEs than some of the low CTE dielectrics. Because of the differences in CTEs, a temperature increase will cause the metal to lengthen at a faster rate than the dielectrics. This difference in expansion can put high stresses on the dielectrics, which can lead to cracking of the dielectric materials. Cracking of dielectrics can cause opens because lines can be pulled apart. Another effect caused by the CTE differential is shear induced debonding, where the dielectric is torn from the power/ground planes. Shear induced debonding exacerbates the CTE-caused cracking mechanisms because the debonded dielectric is essentially "floating" and is not connected to the metallic power/ground planes. The periphery of the debonded area is, however, connected to a metallic plane and tends to move with metallic plane as the metallic pane lengthens with increasing temperature. Cracking then can develop around the periphery as the periphery moves away from the debonded dielectric.

While low CTE metals such as invar, stainless steel, and molybdenum have been used to construct lower CTE power planes for PCBs and LCCs, use of these alternative metals can create a variety of manufacturing complications. These complications include galvanic activity and corrosion, multi-step etching, and complicated waste treatment.

Therefore, without a way to limit failures and fractures caused by CTE differences between dielectrics and power/ground layers and the overall relatively high CTE in PCBs and LCCs, PCBs and LCCs will continue to have a higher numbers of failures and reliability problems.

DISCLOSURE OF INVENTION

Accordingly, the embodiments of the present invention provide conductive materials that have low coefficients of thermal expansion (CTEs) and that are used for power and ground planes. Fibrous materials (such as carbon, graphite, glass, and liquid crystal polymers) with low CTEs are metallized to provide a resultant conductive material with a low CTE. Such fibers may be metallized in their individual state and then formed into a fabric, or these materials may be formed into a fabric and then metallized or a combination of both metallizations may be used. In addition, a graphite layer may be metallized on one or both sides to provide a material that has a low CTE and high conductivity. These metallized, low CTE power and ground planes may then be laminated into a composite used for printed circuit boards (PCBs) or PCBs used as laminate chip carriers. The present invention provides conductors for use in PCBs and LCCs that do not have the problems associated with exotic, low CTE metals.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

Figure 1:
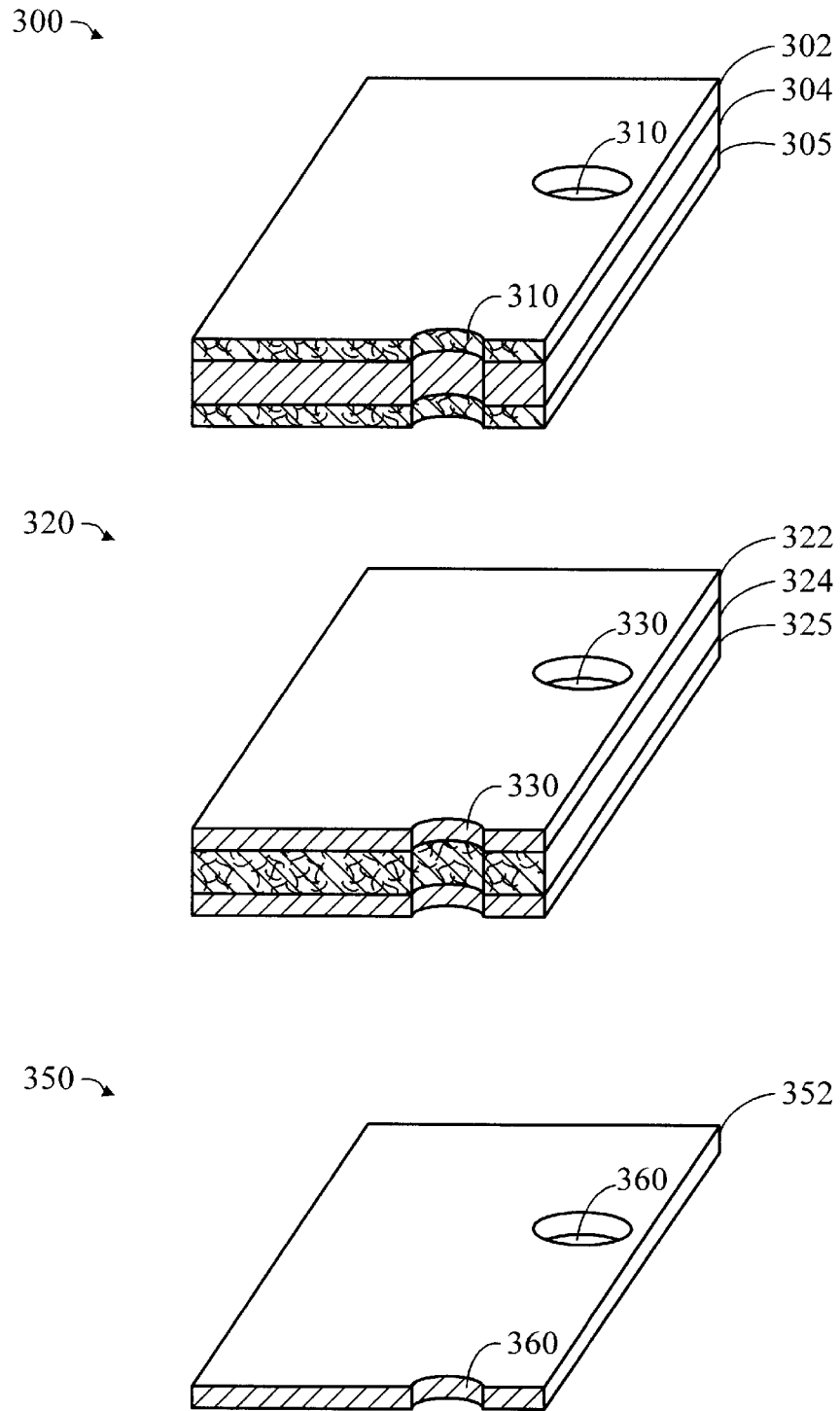
FIG. 1 is cross-sectional views of preferred power or ground planes for several embodiments of the present invention.

The preferred embodiments of the present invention overcome the limitations of the prior art by providing materials with low Coefficients of Thermal Expansion (CTEs) for use in power and ground planes. The power and ground planes can be formed into cores, if desired, and will be used preferably in Printed Circuit Boards (PCBs) or as PCBs used for Laminate Chip Carriers (LCCs). The present invention relates to manufacturing of PCBs. A short introduction to general manufacturing techniques for PCBs will now be given, followed by the preferred embodiments.

Printed Circuit Boards

In order to make a printed circuit board, the starting material is usually a sheet consisting of fiberglass and epoxy resin. This is often termed "prepreg" because the fiber is impregnated with resin during preliminary processing. The resin essentially acts a binder to bind fiber into a board. In place of the fiberglass cloth, it is possible to use compressed paper or other suitable materials. The basic board is therefore a flat, rigid or lightly flexible dielectric material that will be fabricated into the final printed circuit. This starting material can be laminated with a thin layer of copper or other metals on both sides of the board with suitable adhesion. The combination is commonly called copper clad laminate (CCL,). These CCLs can either become simple double sided boards (having two sides of copper lines) or they can be circuitized and laminated with additional dielectric into multilayer composites.

In most cases, holes are provided through these boards (usually by drilling) to accommodate electrical connection of the various electronic components that will be attached. The holes are usually drilled using high speed drilling machines and the locations of the holes are specified in the drawings or design for the boards.

In order to make an electrical connection from one side of the copper laminate through the holes to the other side, the plastic wall of the hole must be made conductive. This is accomplished by a chemical process commonly known in the industry as metallization, and the process consists of a relatively complicated series of chemical tanks and rinses and an activating step to apply a thin copper layer to the hole walls.

Since the copper layer formed by the metallizing process is generally too thin to form a suitable electrical bridge between the two layers of the board, copper electroplating is used to deposit a heavy layer of copper in the holes in order to form a suitable copper cross section for carrying current. Copper plating can be followed by tin-lead or tin plating in order to improve solderability.

After metallization, circuitization is performed on those surfaces that require circuit patterns. The circuit pattern is a circuit design that is applied to the metal surface of the drilled board in accordance with the requirements of the specifications or design. The image can be formed by applying an organic photoresist coating applied as a dry film. Ultraviolet (UV) light is projected through a mask onto the photoresist. The mask contains shapes that block the UV light. For negative photoresist, the areas of the photoresist that are not exposed to the UV light are removed during the subsequent development step. Chemical etching is then used to remove the exposed surface metal. Next, the remaining photoresist is stripped, leaving only the metal pattern.

Figure 4:
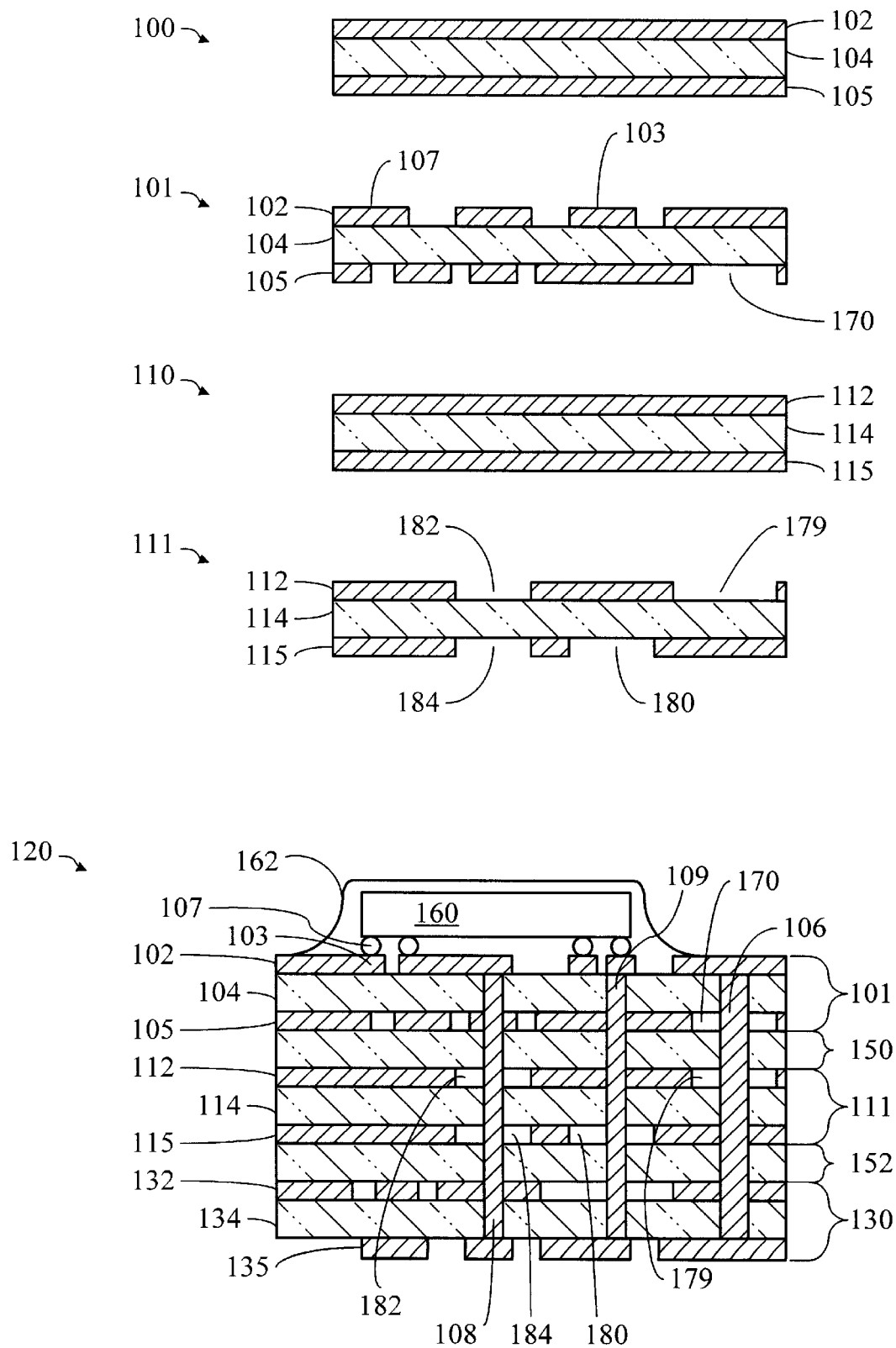
FIG. 4 contains cross-sectional views of a six-layer printed circuit board and the layers that make up a six-layer printed circuit board.

Turning now to FIG. 4, an example of a six-layer PCB and the layers that make up the six-layer PCB are shown. In FIG. 4, portions of a PCB are shown at various manufacturing stages. In this example, six-layer PCB 120 portion is being used as a laminate chip carrier (LCC) that connects chip 160 and PCB/LCC 120 to a PCB (not shown). Six-layer PCB 120 comprises a "composite" formed by pressing (called "laminating") together two signal cores 101 and 130, one power core 111, and dielectric layers 150 and 152. The cores are individually patterned and then pressed to form a composite PCB. During this pressing, the dielectric will reflow into any gaps that exist between the cores and dielectric layers. After pressing, the composite will be drilled, epoxy smeared onto exposed drilled copper layers will be removed, through holes will be plated, and further processing performed. For simplicity, FIG. 4 shows dielectric reflow areas as containing air instead of dielectric. In addition, plated through holes (PTHs) are shown as solid metal, although these will generally be cylindrical metal holes. Finally, tooling holes, which are used to align artwork to the laminate and the layers together, are not shown.

Signal core 100 comprises a dielectric layer 104 sandwiched between two copper layers 102 and 105. Signal core 100 is a CCL on which no processing has been performed. Copper layers 102 and 105 will be signal carrying layers on which lines of copper will be made. Copper layer 102 may also have pads to which chips or surface-mounted packages containing chips will be soldered. Signal core 101 is a representation of signal core 100 after signal core 100 has been patterned. Signal core 101 comprises copper layers 102 and 105, which have been patterned with circuitry, spacing for PTHs and other clearance/tooling holes, and dielectric layer 104. Copper layer 102 has two lines (not numbered) and two pads 107 and 103, while copper layer 105 has five lines. In addition, copper layer 105 has clearance area 170 through which a PTH will exist after signal core 101 is laminated into a composite, drilling performed, and holes plated.

Power core 110 in FIG. 4 comprises a dielectric layer 114 sandwiched between two copper layers 112 and 115. Copper layers 112 and 115 may be thicker than copper layers 102 and 104 to provide extra current carrying capability. Power core 110 is a CCL on which no processing has been performed. Copper layer 112 will become the power plane of a PCB, while copper layer 115 will become the ground plane of a PCB (or vice versa). Power core 111 is a representation of power core 110 after power core 110 has been patterned. Power core 111 comprises copper layers 112 and 115 that are now patterned and dielectric layer 114. Copper layer 112 is patterned with two clearance areas 182 and 179, while copper layer 115 is patterned with two clearance areas 184 and 180. These clearance areas will prevent the power and ground planes from contacting PTHs that will be drilled in these locations after power core 111 has been pressed into a composite and holes have been drilled and plated.

A completed PCB portion is shown as six layer PCB portion 120. It is common to call this PCB a "six layer" board because it has six conductive layers. PCB portion 120 is being used as a LCC to connect chip 160 to a PCB (not shown) underneath metal layer 135. The attachment (not shown) between layer 135 and PCB 120 would generally be through Ball Grid Array (BGA) or similar connections. Six layer PCB portion 120 is shown after signal cores 101 and 130, power core 111, and dielectric layers 150 and 152 have been pressed to form a composite. The composite has been drilled, epoxy smear has been removed from the holes, and the holes have been plated. In addition, components may be attached to the completed LCC. For instance, a chip 160 has been soldered through Controlled Collapse Chip Connection (C4) balls 107 to pads 103 of copper layer 102 of signal core 101. Encapsulation or underfill 162 protects chip 160. Signal core 130 is a patterned signal core similar to signal core 101. Signal core 130 comprises copper layers 132 and 135 and dielectric layer 134. Copper layers 132 and 135 have been patterned to form lines. Dielectric layer 150 has been added between power plane (copper layer) 112 of power core 111 and the copper layer 105 of signal core 101, while dielectric layer 152 has been added between ground plane (copper layer) 115 of power core 111 and copper layer 132 of signal core 130. Each dielectric layer 150, 152 may be made from more than one layer of dielectric.

Several PTHs are shown in PCB 120. PTH 109 connects power plane 112 to a C4 ball 107, a line on patterned copper layer 105, and a line on signal core layer 135. Clearance area 180 prevents PTH 109 from connecting to ground. Note that clearance area 180 would be filled with reflowed dielectric after lamination, but this is not shown in FIG. 4 for simplicity. PTH 108 connects signal lines on copper layers 102, 105, 132, and 135, and the signal line on copper layer 102 also connects to a C4 ball 107. Clearance areas 184 and 182 prevent PTH 108 from contacting ground plane 115 or power plane 112, respectively. PTH 106 connects ground plane 115 with lines or pads on copper layers 135, 132, and 102.

The overall Coefficient of Thermal Expansion (CTE) for PCB 120 remains relatively high even when low CTE dielectrics are used in layers 104, 150, 114, 152, and 134. There remains a high percentage of copper, which raises the overall CTE. This overall, relatively higher CTE creates problems for both PCBs and PCBs being used as LCCs. In the former instance, PCBs may be subject to shear induced debonding or cracking of dielectric materials as temperatures increase and the high CTE PCB expands. Because the semiconductor chips placed on the PCB are in packages, the package and connecting pins or leads are able to absorb stresses caused by increasing PCB size. Thus, the semiconductor chips themselves are usually not affected by increases in size of the PCB. For PCBs used as LCCs, however, semiconductor chips are placed directly on the PCB without having a package and pins or leads. The chip itself then takes the stress of increasing PCB area as temperatures increase.

This can be seen in FIG. 4, where chip 160 is directly connected to metal layer 102 of PCB 120. If the PCB expands with increasing temperature, the expansion caused by a relatively high CTE, C4 balls 107 move with the PCB. The C4 balls 107 are directly connected to the chip, and the chip must absorb the tensile stress caused by the increase in distance between the balls 107. Unfortunately, semiconductor chips are primarily silicon, which is crystalline. The chip itself is easily fractured because of its structure and the balls can also pull away from the chip.

Preferred Embodiments

The preferred embodiments of the present invention overcome the limitations of the prior art by providing conductive materials having low CTEs that are used for power and ground planes in Printed Circuit Boards (PCBs) and PCBs used as Laminate Chip Carriers (LCCs). By providing low CTE materials for power and ground planes in PCBs, the overall CTE of the PCB can be lowered, which decreases the chances of chip failure, dielectric cracking, and shear induced debonding. In addition, the problems (galvanic activity and corrosion, multi-step etching, and complicated waste treatment) associated with the use of the exotic, low CTE metals are completely eliminated or dramatically reduced.

Before proceeding to the preferred embodiments, a short discussion of terminology is beneficial. As stated in the Overview section, "prepreg" is a term that generally connotes fiberglass and epoxy resin. This is often termed "prepreg" because the fiber is impregnated with resin during processing. Sheets of fibrous materials may be called "fiber composites," while sheets of fibrous materials containing resin are generally called "fiber resin composites." Unfortunately, when one or more signal layers are laminated with one or more power/ground planes, or a power/ground plane is laminated between sheets of prepreg, the resulting item is called a "composite." To avoid confusing this composite structure with fiber composites or fiber resin composites, fiber composites and fiber resin composites will be called "fiber laminate." The term "fiber laminate" is intended to encompass all types of prepreg, fiber composites, fiber resin composites, dielectrics, insulators and other materials used in PCB manufacturing. Additionally, embodiments of the present invention may use conductive fiber laminates (such as prepreg infused with copper). It should be noted as well that, while the term "fiber laminate" is used herein, this term is intended to denote all types of thermosetting resins and thermoplastic polymers presently used to construct PCBs, including but not limited to epoxies, bismaleimide triazine epoxy, cyanate esters, polyimides, polytetrafluoroethylene (PTFE) and other fluoropolymers, etc., whether or not they contain any fiber or filler.

The preferred embodiments of the present invention comprise a variety of conductive, low CTE materials that may be used for power and ground planes. For instance, a core of solid, low CTE material (preferable carbon-based, such as graphite) that is metallized on one or both sides can form the basis for a power/ground plane. In addition, metallized, low CTE fibers (such as glass, carbon, and liquid crystal polymer fibers) can be formed into fabrics that can be the basis for a power/ground plane. The preferred conductive materials generally have CTEs that range from –5 to 5 PPM/° C. Materials having CTEs less than 5 PPM/° C. are preferred. A power/ground core formed by using these preferred materials should have a composite CTE ranging from 8 to 12 PPM/° C., depending on the fiber laminate used. Using these cores in a PCB/LCC should result in a PCB/LCC having a composite CTE ranging from 8 to 12 PPM/° C. This is a significant reduction from the CTE of a PCB made with normal (i.e., Copper Clad Laminate (CCL)) layers. A normal PCB will generally have a CTE near or above 17 PPM/° C., even when using low CTE fiber laminate, because the CTE of copper is relatively high and copper comprises a significant percentage (volume or weight) of the PCB. Thus, even when low CTE fiber laminates, which are defined as those fiber laminates that have CTEs close to 17 PPM/° C., are used to manufacture PCBs, the PCB will still usually have a CTE greater than 17 PPM/° C. While conductive materials with CTEs higher than 5 PPM/° C. may be used with embodiments of the present invention, the composite CTE of the resultant PCB may be too high for certain applications. The conductive materials of the present invention are most beneficial when semiconductor chips are directly attached to a LCC. This small difference in CTE between chips and the composite CTE of PCBs/LCCs made in accordance with the current invention limits potential chip fractures due to CTE mismatches. Using conductive materials with higher CTEs will result in higher composite CTEs for the PCB/LCC, which will increase the chances of chip defects and cracking. The particular preferred materials will be discussed after an introduction about preferred methods of making and using low CTE power/ground planes.

Some of the preferred materials used to form low CTE power/ground planes of the present invention may be relatively brittle during drilling or handling stages of PCB or LCC manufacturing. For instance, fibrous materials may be damaged more easily than metal foils during drilling. Furthermore, because photolithographic and etching techniques may not be able to pattern some of these low CTE power and ground planes, it is preferred that some changes to normal PCB or LCC fabrication steps be made. Before proceeding to the preferred materials that may be used for low CTE power and ground planes, general steps involved with using and making low CTE power/ground planes from low CTE material will be discussed.

Turning now to FIG. 1, this figure illustrates three preferred configurations of low CTE power and ground planes. Each of these configurations entails slightly different processing steps to make and use a low CTE power or ground plane in a PCB/LCC. The most preferred configuration of a low CTE power and ground plane is shown as power/ground core 300. Power/ground core 300 comprises a low CTE plane 304 sandwiched between two layers of fiber laminate 302, 305. Two clearance holes 310 are shown; these holes have been drilled in power/ground core 300 to provide clearance for PTHs after power/ground core 300 has been laminated together with another power/ground core, and one or more signal cores. Laminating creates a composite that will subsequently be drilled and metallized to create a PCB or LCC. By laminating a low CTE plane 304 between two fiber laminate layers 302, 305, the fiber laminate layers provide protection for the low CTE plane during drilling and handling. Fiber laminate layers 302, 305 may be non-conductive or conductive. In the latter embodiment, power/ground core 300 would be a conductive composite. Power/ground core 300 could then be laminated between layers of non-conductive fiber laminate to create a larger "core", or power/ground core 300 could be laminated, along with other signal layers, power/ground cores, and non-conductive fiber laminate layers, into a PCB composite. It should be noted that plane 304 may actually have one or more layers of metal on both sides of the plane that abut fiber laminate layers 302, 305. These layers are not shown in FIG. 1.

FIG. 1 also shows second and third less preferred configurations for low CTE power and ground planes that are more susceptible to drilling and handling damage. Power/ground core 320 comprises a layer of fiber laminate 324 sandwiched between two layers of low CTE planes 322, 325. Again, fiber laminate layer 324 can be conductive or non conductive. Power/ground core 320 has been drilled with clearance holes 330. Power/ground core 350 comprises a low CTE plane 352. Similarly, power/ground core 350 has been drilled with clearance holes 360. These are less preferred embodiments of power/ground cores because the low CTE plane is exposed to potential drilling and handling damage. However, if enough care is taken during handling and drilling, minimal or no damage to the low CTE materials making the power/ground planes might result. Encapsulating low CTE materials, which are susceptible to handling or drilling damages, in fiber laminate lessens the potential for damage and is, thus, preferred.

Each of these cores may be processed in a slightly different manner. In general, power/ground core 300 will be laminated after an optional adhesion promoting process (using chemicals such as silane) is performed on low CTE plane 304. Then the power/ground core will generally be drilled with clearance holes 310. Drilling is used at this stage in lieu of patterning with photoresist and etching because fiber laminate (in its dielectric or conductive configurations) and most of the low CTE fibrous materials in general cannot be etched. Additionally, clearance holes 310 may be filled with an insulator/dielectric at this step. The drilled power/ground core 300 can then be laminated into a composite with another power/ground core and one or more signal cores. The composite is then drilled and metallized (for PTHs) to form a PCB or LCC. Optionally, power/ground core 350 can be drilled, treated with an adhesion promoting process, then laminated with two sheets of fiber laminate into power/ground core 300. While mechanical drilling of power/ground core 350 is suitable for creating clearance holes and tooling holes, laser or other less damaging drilling is preferred for power/ground plane materials that are susceptible to drilling damage.

In general, power/ground core 320 may be formed by treating low CTE layers 322, 325 with an (optional) adhesion promotion process. A sheet of fiber laminate (conductive or non-conductive) is then laminated between the two low CTE layers. Drilling is usually performed next to create clearance (or tooling) holes 330. Preferably, laser or other less damaging drilling would be used for power/ground plane materials that are susceptible to drilling damage. Laser drilling has the additional advantage in this embodiment of patterning the two conductive, low CTE layers with different clearance hole patterns. Filling of clearance or tooling holes with insulating/dielectric material may be performed next. Power/ground core 320 may then be laminated into a composite along with another power/ ground core and one or more signal planes.

In general, power/ground core 350 may be drilled, treated with an optional adhesion promoting material (such as a silane or copper oxide treatment), and laminated with two layers of fiber laminate (conductive or non-conductive) to form core 300. Optionally, power/ground core 350 can be drilled, treated with an adhesion promoting step, and then laminated into a composite with another power/ground core, several layers of fiber laminate, and one or more signal cores. For instance, to form a six-layer composite, the layers from "top" to "bottom" of the composite would be as follows: a signal core (such as signal core 101 of FIG. 4), one or more layers of fiber laminate, a power/ground core 352, one or more layers of fiber laminate, a power/ground core 352, one or more layers of fiber laminate, and a second signal core (such as signal core 130 of FIG. 4). This composite can then be drilled and metallized to create a PCB/LCC.

Figure 2:
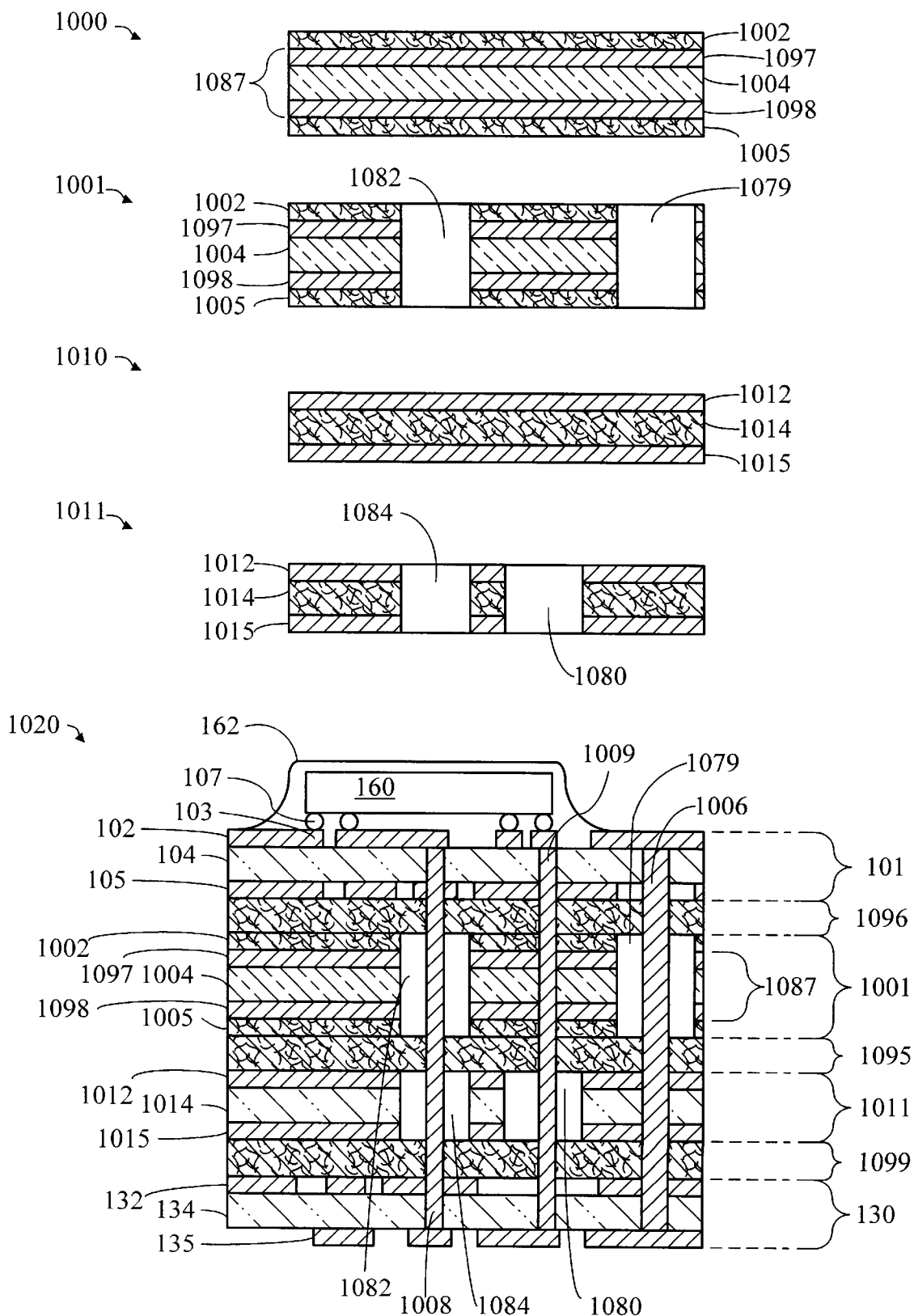
FIG. 2 is cross-sectional views of a six-layer printed circuit board and the layers that make up a six-layer printed circuit board in accordance with a preferred embodiment of the present invention.

As previously discussed, it is preferred that conductive materials used for low CTE power or ground planes that are susceptible to drilling or handling damage be formed into a power/ground core wherein the low CTE conductive material is sandwiched or encapsulated between two layers of fiber laminate. Forming power or ground cores in this manner will provide support and protection for the low CTE conductive material during drilling steps. This protection reduces the amount of fibrous material that might be broken by the drilling process. A power core like power core 320 (similar to power core 110 of FIG. 4) or power core 350 may also be made, but drilling and/or handling might cause some splintering and cracking of the low CTE material. Additionally, loose fibrous or carbon material may contaminate some processing steps. By encapsulating the fibrous or carbon material and adding insulator/dielectric into drilled holes, the fibrous material is less likely to contaminate subsequent processing steps. Referring now to FIG. 2, several cross-sectional views of power and ground cores are shown, along with a six layer PCB/LCC made with these cores. FIG. 2 is an example illustrating a power core 1000, a drilled power core 1001, a ground core 1010, a drilled ground core 1011, and a six-layer PCB/LCC 1020 that is used as an LCC. Power core 1000 was formed by performing an adhesion promoting process on low CTE power plane 1087, then laminating this plane between two layers of fiber laminate 1002 and 1005. Low CTE power plane 1087 in this instance is a graphite layer 1004 that has metal layers 1097, 1098 formed on its surface. Power core 1000 was then drilled to create clearance holes 1082 and 1079. Conversely, a "normal" CCL power core would have been etched, after a photoresist mask would have been applied, to create an imaged power core (i.e., power core 111 of FIG. 4). Because etching may not be possible on some of the low CTE, conductive materials used for power/ground planes or on fiber laminate, drilling is the preferred method of creating clearance holes. Power core 1000 and 1001 in this example is essentially a low CTE, conductive layer sandwiched between two non-conducting fiber laminates.

Ground core 1010 was formed by performing an adhesion promoting process on low CTE ground planes 1012, 1015 (which are, in this instance, metal-coated fibrous materials), then laminating these planes on both sides of a layer of conductive fiber laminate. Ground core 1010 was then drilled to create clearance holes 1084 and 1080. Ground core 1010 in this example is essentially one conductive plane having three conductive layers (one layer of conductive fiber laminate sandwiched between two layers of low CTE, conductive materials). Although not shown in FIG. 2, dielectric or other insulator may be added to power core 1001 and ground core 1011 to fill the clearance holes in these cores.

Concerning conductive fiber layer 1014, a preferred method of making this layer is to add 40 percent by volume of copper powder to a fiber or fiber/resin layer. During lamination, the copper should distribute evenly throughout the fiber layer. Other conductive fillers may be used, along with other types of layer materials, but this filler and layer material has the benefits of being relatively inexpensive and being commonly used in PCB manufacturing.

After the cores have been drilled (and insulator added, if desired), power core 1001 and ground core 1011 are then pressed together, along with patterned signal cores 101, 130 and fiber laminate layers 1096, 1095, and 1099, to form a composite. This composite is drilled and metallized to create PTHs. After attaching components to the PCB/LCC, exemplary six layer PCB/LCC portion 1020 results. Fiber laminate layers 1095, 1096, and 1099 are non-conductive, dielectric layers used to isolate signal, power and ground cores. In addition, these layers adhere the power, ground, and signal cores together. Power core 1001 does have a fiber laminate layer 1005 that could be used to adhere power core 1001 to ground core 1011. Similarly, fiber laminate layer 1002 of power core 1001 could adhere to signal core 101. In general, however, fiber laminate layer 1005 (and 1002) will be fully cured, which means that another fiber laminate layer will have to be used to bind the power, ground, and signal cores together. Some fiber laminates, once fully cured, will no longer reflow enough to adhere sufficiently to another layer. It is possible to partially cure these layers, which would allow some reflow when lamination of the cores occurs. In addition, some fiber laminate layers will reflow multiple times and will provide sufficient adhesion between cores. In these instances, fiber laminate layers 1095, 1096 may not be needed for adhesion. Although fiber laminate layers may not be required in these instances for adhesion purposes, there may be other reasons for using additional fiber laminate layers (such as layer 1095). For instance, if better electrical insulation is desired, an additional layer of fiber laminate may provide this insulation. Note that fiber laminate layer 1099 will generally be necessary to provide electrical insulation (in addition to adhesion) as well as providing fill resin for clearance holes 1082 and 1079 between patterned signal layer 132 and metallized fiber layer 1015.

PTH 1008, similar to PTH 108 of FIG. 4, connects lines of signal layers 102 and 105 of signal core 101 with lines of signal layers 132 and 135 of signal core 130. Clearance areas 1082 and 1084 prevent ground and power layers from contacting the PTH. Although clearance areas 1082 and 1084 are shown filled with "air," in reality these areas will usually be filled with dielectric: either the areas were filled with dielectric after drilling the power or ground core, or dielectric/insulator from fiber laminate will fill these areas during lamination.

PTH 1009, similar to PTH 109 of FIG. 4, joins pad 103 (and a C4 ball 107) and a line on layer 135 of signal core 130 with power plane 1001. In this example, power plane 1001 comprises conductive plane 1087, which actually has three conductive layers (graphite layer 1004, and two metal layers 1097, 1098). All three layers of conductive plane 1087 are in contact with PTH 1009 in this example. Clearance area 1080 prevents PTH 1009 from connecting to ground core 1011. Similarly, PTH 1006, similar to PTH 106 of FIG. 4, joins lines on layer 102 of signal core 101 and on layers 135, 132 of signal core 130 with ground core 1011. Ground core 1011 comprises three conductive layers (two low CTE planes 1012 and 1015, and one conductive fiber laminate 1014), all of which are connected to PTH 1006. Clearance area 1079 prevents PTH 1006 from connecting to power layer plane 1087.

In the example of FIG. 2, most fiber laminate layers on the various cores are shown as being relatively thin. For instance, fiber laminate layers 1002, and 1005 are thin. This is for representation only, as those skilled in the art realize that more layers, thinner, or thicker layers of fiber laminate may be added if needed. Comparing six layer PCB/LCC 1020 of FIG. 2 with six layer PCB/LCC 120 of FIG. 4, the major differences are that PCB/LCC 1020 has separate power and ground cores and that these power/ground cores are formed differently than normal CCL cores. PCB/LCC 1020 also has low CTE power and ground planes that comprise a large portion of the LCC. Signal layers 102, 105, 132, and 135, while having some metal, mainly contain fiber laminate. The overall CTE of the signal cores 101 and 130 will, therefore, be close to the CTE of the fiber laminate layers 104 and 134. If low CTE dielectric is being used in these fiber laminate layers, the CTE will be low. High PCB CTE in this case will be mainly caused by the metal layers of the power/ground core, which is usually a CCL. In this instance, the copper in the CCL drives the CTE of the power/ground core because of the amount of copper in the power and ground planes. This high CTE of the power/ground core raises the overall CTE of the PCB, leading to potential shear induced debonding, dielectric or chip cracking, tensile stress on chips attached to the PCB (used as a LCC), and other deleterious effects.

In FIG. 2, however, ground plane 1011 comprises metal-clad, low CTE fibrous materials. In addition, power plane 1087 comprises a metal-clad graphite sheet. Both of these planes contain a substantial amount of low CTE materials, which lower the total CTE of the core. Thus, both cores have lower overall CTEs than an equivalent CCL core, and these lower overall CTEs diminish the total CTE of the PCB/LCC. Additionally, the low CTEs of the cores are achieved without the use of alternative metals (such as invar, stainless steel, and molybdenum) that can create a variety of manufacturing complications, including galvanic activity and corrosion, multi-step etching, and complicated waste treatment.

Figure 3:
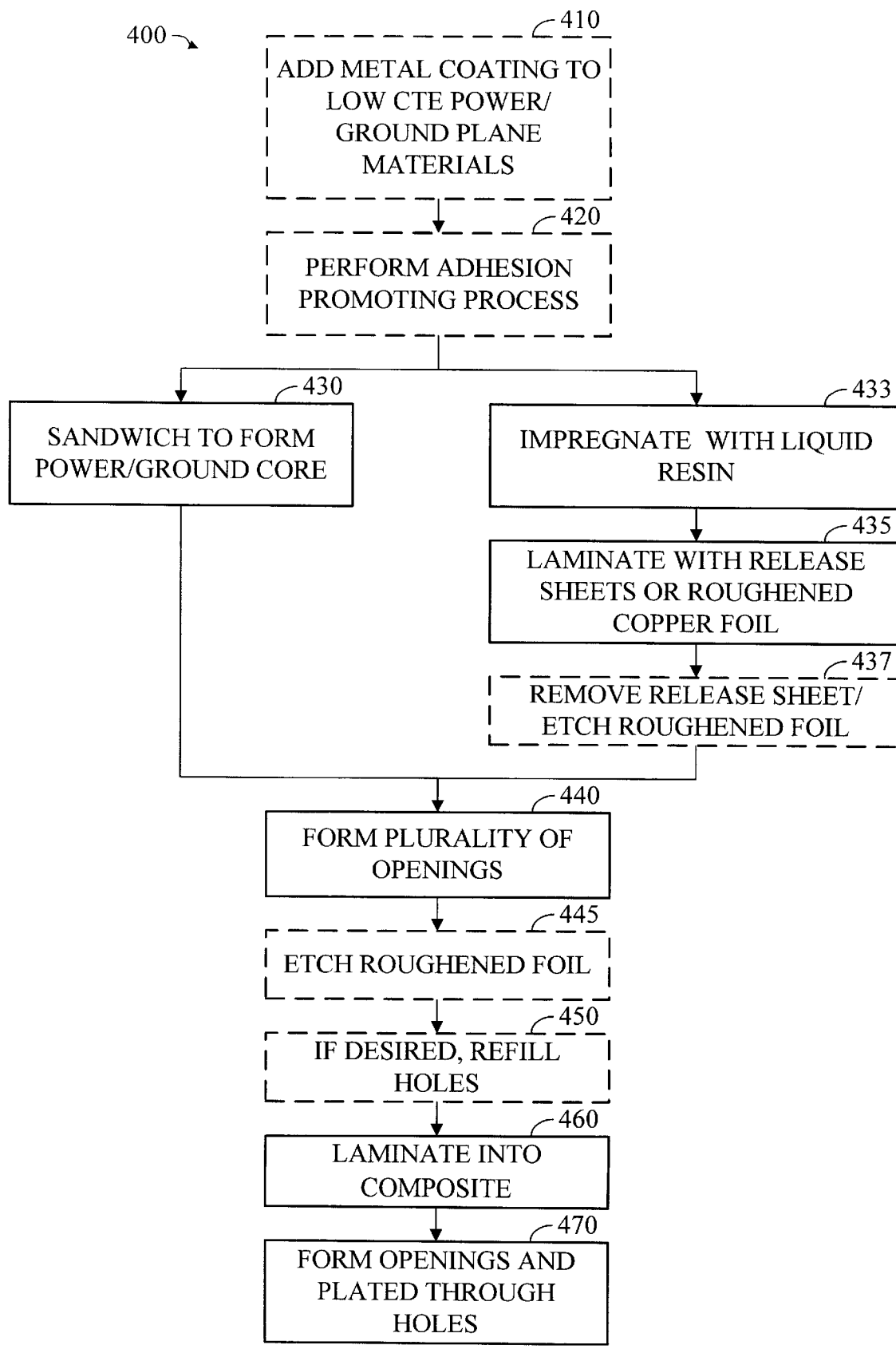
FIG. 3 is a process flow chart of a method for making and using a power or ground plane in accordance with a preferred embodiment of the present invention.

A preferred method of forming a power or ground core (such as power core 1000) containing low CTE conductive material in accordance with the current invention is shown in FIG. 3. Method 400 of FIG. 3 is preferably used to form both the power and ground cores and to combine the power and ground cores into a composite PCB or LCC. This method is also used for the preferred embodiments wherein low CTE conductive material is sandwiched between two layers of fiber laminate, as in power plane 1000. This embodiment allows more protection for the internal low CTE, conductive material. In addition, fiber laminate can help "seal" metal-covered fibrous materials and other loose materials, which helps to keep the fibrous material internal to the laminate. This is particularly helpful in the case of carbon materials, which could potentially contaminate portions of the PCB/LCC and the manufacturing process. Method 400 begins when an optional thin layer of metal coating is made over the low CTE material being used (step 410). The metal-clad fibrous materials of the present invention generally have enough metal to carry the required current; if additional current carrying capacity is needed, more metal may be formed on the fibers in step 410.

Additionally, if the preferred low CTE materials of the present invention have not been metallized, then the materials can also be metallized in this step. For instance, if an non-metallized carbon fiber tow is being used as the low CTE material, the tow could be metallized and then formed into a woven fabric in step 410. The fabric could then have additional metal added onto the fabric, if desired, in step 410.

In the specific example of power core 1000, a graphite layer 1004 is coated with metal on both sides in step 410 to create power plane 1087. In short, step 410 may be used both to metallize those materials that are not coated with metal and to add additional metal to materials that are already coated with metal. The types of preferred materials to be used for power and ground planes will be discussed in detail after method 400 is discussed.

The low CTE material is then optionally treated with an adhesion promoting chemical process or copper oxide treatment (step 420). Next, the conductor is laminated or sandwiched between fiber laminate (step 430) to form an encapsulated, low CTE power or ground core. In general, standard lamination processes will be used to laminated the low CTE ground/power material. Alternatively, the fibrous, low CTE materials may be impregnated with resin using a standard impregnation process (step 433). This standard impregnation process essentially encapsulates the fibrous material. The resin impregnated cloth is then laminated against a release sheet or a roughened copper foil. If a roughened foil is used, it can either be etched off (step 437) or left on through drilling (step 440). The release sheet will generally be removed (step 435) prior to drilling.

Because fiber laminate generally cannot be etched to form the necessary electrical clearance holes (and other openings), these openings are formed in the power/ground core (step 440). Generally, the openings will be formed by drilling the clearance hole pattern or tooling holes into and through the laminate and low CTE plane. Drilling can either be done by mechanical drills or by use of a laser or other similar hole-making apparatuses. If roughened foil had been laminated on the low CTE material (step 435) and not removed (in step 437), it is now removed by etching (step 445). At this point, the openings can be refilled with pure resin, resin containing a non-conductive filler, or other appropriate insulator/dielectric (step 450). The power/ground core can be formed into a composite, preferably by re-laminating or pressing into a composite board structure (step 460). Extra resin from fiber laminate flows into and fills the drilled power plane holes during the lamination cycle if the holes were not filled in step 450. Re-drilling to create the holes used for PTHs, and metallization of these holes, may be performed next (step 470). After step 470, a PCB/LCC similar to PCB/LCC 1020 should exist.

While method 400 is the preferred method for making PBCs or LCCs with low CTE power/ground planes, the steps in method 400 may change slightly depending on the configuration of power/ground core used. For instance, two layers of low CTE, conductive material can be laminated on a fiber laminate, such as previously shown in power and ground core 320 of FIG. 1. In this embodiment, the processing steps remain very similar to those shown in method 400. For example, steps 410 and 420 of method 400 may be performed to add additional metal to the conductive material and to promote adhesion, respectively. A sheet of fiber laminate (conductive or non-conductive) could then be laminated between the two low CTE layers. In addition, the liquid resin impregnation step (step 433) may be performed prior to laminating a fiber laminate layer between two layers of low CTE, conductive materials. Drilling is then usually performed to create clearance or tooling holes (step 440).

Preferably, laser or other less damaging drilling would be used for power/ground plane materials that are susceptible to drilling damage. Laser drilling has the additional advantage in this embodiment of patterning the two conductive, low CTE layers with different clearance hole patterns. Filling of clearance or tooling holes with insulating material may be performed at this stage (step 450). Power/ground core 320 may then be pressed into a composite (step 460) along with another power/ground core, one or more signal planes, and non-conductive fiber laminate layers. Then, the composite will be drilled and metallized to create a PCB/LCC (step 470).

In addition, a power/ground core similar to power/ground core 350 of FIG. 1 may also be used to create a power or ground plane. In this embodiment, the processing steps used to create a power and ground plane differ somewhat from method 400. For example, drilling (step 440) could take place before or after step 410 (if performed). The low CTE conductive plane then might be treated with an optional adhesion promoting material (step 420), and laminated with two layers of fiber laminate (conductive or non-conductive) to form core 300 of FIG. 1. In this embodiment, step 450 will generally be unnecessary, as the lamination process should fill the holes with fiber laminate. Optionally, a low CTE, conductive plane similar to power/ground core 350 can be drilled, treated with an adhesion promoting step (step 420), and then pressed into a composite (step 460) with another power/ground core, several layers of fiber laminate, and one or more signal cores. This composite can then be drilled and metallized to create a PCB/LCC (step 470).

Finally, method 400 is applicable to other configurations of PCBs in addition to six-layer PCBs as shown in FIG. 2. A higher or lower number of layers may be formed by adapting the processes of method 400 to that particular number of layers. For instance (referring back to FIG. 2), if a four layer PCB is desired, a power core 1000 could be laminated on the outer surface of 1002 with a copper layer. Then drilling could form a power core 1001. Similarly, a ground core 1010 could be laminated on the outer surface of 1015 with a fiber laminate and a copper layer. Then drilling could form the ground core 1011. The openings created in the power and ground cores during drilling could be filled with insulator. The two copper laminate layers could then be patterned and the two power and ground cores formed into a composite. Drilling and plating for PTHs could be performed to create a PCB. Alternatively, drilled power core 1001 and drilled ground core 1011 could be formed into a composite with layers in the following order: a copper layer, an optional non-conductive fiber laminate layer, power core 1001, ground core 1011, a non-conductive fiber laminate layer, and a copper layer. Then the two copper layers could be patterned into signal layers and the composite drilled and metallized to create a four-layer PCB.

The manners of using low CTE materials to make low CTE, conductive power and ground planes have now been discussed in a general sense. These methods and materials may be used with any of the particular low CTE, conductive materials discussed below. If there are any additional processing steps that are preferred for use in order for a material to be formed as a power or ground core, these steps will be discussed in relation to the power/ground material.

The most preferred embodiment of a power/ground plane that contains a low CTE material is a graphite or carbon sheet that has copper on one or both sides. Graphite is a naturally occurring, conductive material made of carbon. The term "graphite" refers to a peculiar and particular arrangement of carbon atoms. Graphite may be formed naturally or may be man-made. While there is somewhat of a crystalline structure in graphite, graphite's electrical conductive properties are primarily anisotropic. Very pure crystalline graphite will have excellent electrical and thermal conductivity and a negative CTE. Bulk graphite will generally have a much lower electrical and thermal conductivity, and will have a low positive to negative CTE.

Those skilled in the art will realize that graphite or carbon sheets suitable for use as the base material for power/ground planes may be made in any number of ways. For instance, bulk graphite may be sintered or compressed into a thin graphite sheet. Graphite sheets may be made through chemical vapor deposition, which creates highly ordered pyrolytic graphite. The latter sheets tend to be fragile, however, and are very costly. In addition, graphite sheets may be formed by winding carbon fiber around a core to create a carbon fiber spool, removing the core, pressing the spool flat, and then graphitizing the spool under high heat. In certain situations, this results in a sheet wherein the carbon fibers have lost all orientation and shape, and the sheet is essentially better crystallized, more pure graphite. These methods of forming graphite/carbon sheets are well known in the art.

By depositing metal on graphite or carbon sheets, the combined material has a lower CTE. Metal can be deposited on graphite by a number of methods that are well known to those skilled in the art. For instance, sputtering, evaporation, or chemical vapor deposition may be used to deposit metal on graphite. These metal cladding methods will be described in more detail below. Metal may be clad on one or both sides of the graphite sheet, although having metal clad on both sides of the sheet is preferred because this provides more metal and increased current carrying capacity.

This metal-clad graphite or carbon material can be used with and formed into PCBs and PCBs used as LCCs in the manners shown and described above. For instance, this conductive sheet may be used to make a power/ground core similar to power/ground core 300, 320, or 350. The resultant PCBs/LCCs will have overall low CTEs, which reduce shear induced debonding and cracking of chips and C4 connections.

Additional preferred materials for creating low CTE, conductive power and ground planes may be loosely referred to as fibrous conductive materials. These preferred additional materials include metallized fabrics (such as liquid crystal polymers), metallized carbon fiber fabric, and metallized glass fibers. Fabrics can further be broken into woven fabric (fabrics having some non-random structure) and random paper fabrics. Random paper fabrics are generally made from fibers placed in random orientations. Random paper fabrics have no identifiable fiber structure.

For instance, a preferred material suitable as a low CTE power/ground plane is metal-coated, low-CTE organic fibers, such as liquid crystal polymers (LCPs). LCPs are made by several companies, and some of these fibers are better known by their trademarks. Aramid is an LCP made by DuPont that, in some versions, is called KEVLAR. VECTRAN is an LCP made by Hoechst-Celanse. These fibers have CTEs on the order of about −5 to 5 Parts Per Million per degree Centigrade (PPM/° C.). In addition, these fibers offer thermal stability. Additional types of organic fibers, which have CTEs similar to those offered by LCPs, that are suitable for use with the current invention include SPECTRA (which is a polyethylene made by Allied Signal). These materials may be purchased in woven and random paper fabrics. Additionally, some LCPs may be purchased already clad with metal. For instance, ARACON is a DuPont trademark for metal-clad aramid fibers.

While some of these organic fibrous materials may be purchased as coated fabric, metal-coated organic fibrous material suitable for use as a power or ground plane may be also made by the following steps. First, the organic fibrous material is placed into a chamber and held in a slightly stretched and/or flat position. Having the material stretched or flattened ensures that metal will evenly cover exposed surfaces. Metal is then deposited on the organic fibrous material. Such deposition may be performed in a number of manners, including plating, sputtering, evaporation, or chemical vapor deposition. If desired or necessary by the process, the organic fibrous material may be turned over and more metal deposited. For instance, if sputtering is used, metal will usually be deposited only on one surface of the fabric. While the fabric may be used in this format, more metal will generally be added on the other side of the fabric to increase the current-carrying capabilities of the fabric. Alternatively, the fabric may be sputtered on both sides simultaneously using a rollto-roll format. After sputtering or chemical vapor deposition, even more metal may be added to the fabric by means of conventional plating. This additional metal will increase the current carrying capacity of the metal fabric power/ground planes. These processes may also be used to coat carbon or graphite sheets, discussed above, with metal. In addition, these processes may also be used to coat other preferred low CTE materials, discussed below, with metal. Furthermore, these techniques may also be used to coat carbon or graphite sheets, described above, with metal.

Once formed into a metallized fibrous sheet, these low CTE, conductive sheets may be used to make a power/ground core similar to power/ground core 300, 320, or 350. Additionally, any of the previously discussed methods for making these cores and integrating them into a PCB/LCC may be performed.

Another most preferred metallized fibrous material suitable for use as a power or ground plane in PCBs or LCCs is metal-coated carbon or graphite fibers. Because carbon or graphite fiber comes both as a weave and as single yarn or tows, metallization of the fiber may occur in both states. For instance, metal may be deposited onto carbon or graphite fiber fabric. Alternatively, metal may be deposited onto carbon or graphite fibers and the carbon or graphite fibers woven into cloth or fabric. Carbon and graphite fibers may be bought already coated with metal and already formed into a tow or yarn. This tow or yarn can then be used to weave a relatively flat woven fabric. In addition, carbon fiber may be bought in a random paper sheet. Any carbon fiber with a low CTE (preferably less than 2 PPM/° C.) may be used with embodiments of the present invention.

As an example, a 1 K (1000 6 micrometer fibers per yarn or tow) graphite/carbon fiber tow can be plated with between 50 to 60 weight percent of copper. This plated tow can then be used to weave a 30×30 thread per inch plain weave fabric. As explained in reference to FIG. 3, one method of manufacturing a power/ground core is to treat this fabric with an adhesion promotion step, such as a silane coupler or copper oxide conversion process. The treated fabric is impregnated with resin using a standard impregnation process. The resin impregnated cloth is then laminated against a release sheet or a roughened copper foil. If a roughened foil is used, it is generally etched off at this point. The release sheet is removed and the part is then drilled with a clearance hole pattern. In this example, the patterned power plane is then laid up into a composite and adhered to with fiber laminate sheets. The composite is then drilled and plated normally. Where the drill penetrated the carbon/composite fabric, a PTH connection is made. The fabric is a tight weave and provides an essentially continuous layer so that a connection can be formed under any drilled hole location.

Following this process can yield a power plane that is 60% by volume metalcoated carbon fiber, and will have a CTE of about 9 PPM/° C. This CTE is a considerable reduction over the CTE of a solid copper plane, which is about 17 PPM/° C. The 9 PPM/° C. figure was generated by using a carbon fiber having a CTE of about 2 PPM/° C. Even lower CTEs may be achieved by using graphite fiber having lower CTEs. Carbon and graphite fiber CTEs range from about −1.4 PPM/° C. to about 2.0 PPM/° C. This power/ground plane should have the current-carrying capability of about 1 ounce of pure copper, but the thickness of the structure will be about 3–4 mils thick instead of the 1.4 mils thickness of 1 ounce of copper.

In addition, carbon fiber and graphite are relatively inert with respect to most standard PCB chemical processes. Thus, etching and other processes tend not to affect the carbon fiber and graphite.

Once formed into a metallized fibrous sheet, these low CTE, conductive sheets made of metallized carbon fiber may be used to make a power/ground core similar to power/ground core 300, 320, or 350. Additionally, any of the previously discussed methods for making these cores and integrating them into a PCB/LCC may be performed.

Another preferred embodiment that is fibrous and has a low CTE is metallized glass or quartz fibers. As with carbon fiber, glass and quartz fibers may be bought as individual fiber yarns or as sheets of woven or random paper fiber. The yarn strands may be metallized and then formed into fabric, or the already formed sheets of fiber may be metallized. Additional metal may be added to each fabric to yield additional current carrying capability. Currently, these fibers cannot be purchased with metal coatings. To create a metal coated fiber or fabric, the methods previously described may be used to create fibers coated with metal, or fabrics coated with metal. In addition, glass fiber sheets may be purchased that are in random paper format. These sheets can be metallized using the previously discussed methods of metal deposition.

Glass comes in a wide variety of forms, many of which are achieved by adding certain "impurities" to silica. For instance, S-glass is a silica-alumina-magnesia compound that can be wound into fibers or not wound; E-glass is a lime-alumina-borosilicate ($Ca—Al_2O_3—SiO_2$) compound that is primarily used in woven fabrics; and D-glass is a glass possessing a low dielectric constant. Common glass fibers have CTEs in the range of about 1–3 PPM/° C. For instance E-glass has a CTE of about 2.8 PPM/° C., while S-glass has a CTE of about 1.6–2.2 PPM/° C.

A power/ground core formed using copper coated glass and laminated with resin (as in method 400) can have a CTE of about 12 PPM/° C. at about 60 percent by volume of metal-coated glass fiber. Again, this CTE is a considerable reduction over the CTE of a solid copper plane (or a PCB made with solid copper planes) which is about 17 PPM/° C.

Once formed into a metallized fibrous sheet, these low CTE, conductive sheets made of metallized glass fibers may be used to make a power/ground core similar to power/ground core 300, 320, or 350. Additionally, any of the previously discussed methods for making these cores and integrating them into a PCB/LCC may be performed.

It should be noted that the fibrous materials used as power and ground planes in the present invention are also porous to water and other solvents. Being porous to water and other solvents reduces delamination of fiber laminate layers and the incidence of cathodic/anodic filament growth in PCBs. Porous power/ground planes are discussed in copending application EN9-98-002, "POROUS POWER AND GROUND PLANES FOR REDUCED PCB DELAMINATION AND BETTER RELIABILITY."

Thus, the embodiments of the present invention provide a variety of low CTE materials that may be used to create power/ground cores that form the basis of PCBs or PCBs used as LCCs. These low CTE materials, when formed into power/ground cores, reduce stresses on layers of the PCB/LCC and the chips and chip connections attached thereto. These reduced stresses are particularly beneficial in PCBs used as LCCs because chips are attached directly to the LCC and cannot tolerate very much tensile stress before cracking. The fibrous embodiments of the present invention have the additional advantage of being porous to water or other solvents.

Although copper has been mainly discussed as the metallization metal, those skilled in the art will realize that techniques used to deposit copper may also be used to deposit silver, gold, aluminum, tin, etc. In addition, even if copper is used as the base metal for metallization, additional amounts of other metals may be added at certain processing steps. For instance, some manufacturers will add small amounts of gold during processing to enhance the conductivity of base connections.

What is claimed is:

1. A power/ground core for use in printed circuit boards, the power/ground core comprising:
   at least one layer of fiber laminate; and
   at least one layer of conductive material, the conductive material having a coefficient of thermal expansion (CTE) that is lower than the CTE of a copper plane, and wherein
   the CTE of the conductive material is less than 5 PPM/C.

2. The power/ground core of claim 1 wherein the at least one layer of conductive material is two layers of conductive material, the at least one layer of fiber laminate being sandwiched between the two layers of conductive material.

3. The power/ground core of claim 1 wherein the at least one layer of fiber laminate is two layers of fiber laminate, the at least one layer of conductive material being sandwiched between the two layers of fiber laminate.

4. The power/ground core of claim 1 wherein the at least one layer of fiber laminate is non-conductive.

5. The power/ground core of claim 1 wherein the at least one layer of fiber laminate is selected from the group consisting essentially of epoxy, bismaleimide triazine epoxy, cyanate ester, polyimide, polytetrafluoroethylene (PTFE), polytetrafluoroethylene, and fluoropolymer.

6. A power/ground core for use in printed circuit boards, the power/ground core comprising:
   at least one layer of fiber laminate; and
   at least one layer of conductive material, the conductive material having a coefficient of thermal expansion (CTE) that is lower than the CTE of a copper plane, wherein the
   at least one layer of fiber laminate is conductive.

7. A power/ground core for use in printed circuit boards, the power/ground core comprising:
   at least one layer of fiber laminate; and
   at least one layer of conductive material, the conductive material having a coefficient of thermal expansion (CTE) that is lower than the CTE of a copper plane, wherein the
   conductive material comprises a metal-clad carbon or graphite sheet.

8. A power/ground core for use in printed circuit boards, the power/ground core comprising:
   at least one layer of fiber laminate; and
   at least one layer of conductive material, the conductive material having a coefficient of thermal expansion (CTE) that is lower than the CTE of a copper plane, wherein the
   conductive material comprises metal-coated fibrous material woven into a fabric or formed into random paper fabric.

9. The power/ground core of claim 8 wherein the fibrous material is selected from the group consisting essentially of carbon fiber, graphite fiber, liquid crystal polymer fiber, polyethylene fiber, quartz fiber, and glass fiber.

10. A printed circuit board (PCB), the PCB comprising:
    at least one signal core, each signal core comprising at least one signal layer and at least one layer of fiber laminate; and
    at least one power/ground core comprising:
      at least one layer of fiber laminate; and
      at least one layer of conductive material, the conductive material having a coefficient of thermal expansion (CTE) that is lower than the CTE of a copper plane, and wherein the conductive material comprises metal-coated fibrous material woven into a fabric or formed into random paper fabric.

11. The PCB of claim 10 wherein the at least one layer of conductive material is two layers of conductive material, and wherein the at least one layer of fiber laminate of the at least one power/ground core is sandwiched between the two layers of conductive material.

12. The PCB of claim 10 wherein the at least one layer of fiber laminate of the at least one power/ground core is two layers of fiber laminate, the at least one layer of conductive material being sandwiched between the two layers of fiber laminate.

13. The PCB of claim 10 wherein the at least one layer of fiber laminate of the at least one power/ground core is non-conductive.

14. The PCB of claim 10 wherein the at least one layer of fiber laminate of the at least one power/ground core is conductive.

15. The PCB of claim 10 wherein the fibrous material is selected from the group consisting essentially of carbon fiber, graphite fiber, liquid crystal polymer fiber, polyethylene fiber, quartz fiber, and glass fiber.

16. The PCB of claim 10 wherein the at least one layer of fiber laminate of the at least one power/ground core is selected from the group consisting essentially of epoxy, bismaleimide triazine epoxy, cyanate ester, polyimide, polytetrafluoroethylene (PTFE), polytetrafluoroethylene, and fluoropolymer.

17. A printed circuit board (PCB), the PCB comprising:
    at least one signal core, each signal core comprising at least one signal layer and at least one layer of fiber laminate; and
    at least one power/ground core comprising:
      at least one layer of fiber laminate; and
      at least one layer of conductive material, the conductive material having a coefficient of thermal expansion (CTE) that is lower than the CTE of a copper plane, wherein the CTE of the conductive material is less than 5 PPM/C.

18. A printed circuit board (PCB), the PCB comprising:
    at least one signal core, each signal core comprising at least one signal layer and at least one layer of fiber laminate; and
    at least one power/ground core comprising:
      at least one layer of fiber laminate; and
      at least one layer of conductive material, the conductive material having a coefficient of thermal expansion (CTE) that is lower than the CTE of a copper plane, wherein the conductive material comprises a metal-clad carbon or graphite sheet.

* * * * *